United States Patent

Marchiò et al.

[11] Patent Number: 4,701,638
[45] Date of Patent: Oct. 20, 1987

[54] ANTISATURATION CIRCUIT FOR INTEGRATED PNP TRANSISTOR

[75] Inventors: Fabio Marchiò, Gallarate; Pietro Menniti, Milan, both of Italy

[73] Assignee: SGS Microelettronica S.p.A., Catania, Italy

[21] Appl. No.: 860,741

[22] Filed: May 7, 1986

[30] Foreign Application Priority Data

Jun. 24, 1985 [IT] Italy ................... 21272 A/85

[51] Int. Cl.$^4$ ............................. H03K 3/33
[52] U.S. Cl. ...................... 307/300; 307/280; 307/255; 307/540; 307/557
[58] Field of Search ........... 307/280, 300, 296 R, 307/313, 255, 564, 557, 540, 303, 253

[56] References Cited

U.S. PATENT DOCUMENTS 4,021,687 5/1977 Yoshimura ................... 307/300
4,382,195 5/1983 Pohl et al. .................... 307/303

FOREIGN PATENT DOCUMENTS 2903445 8/1979 Fed. Rep. of Germany ...... 307/255
126320 10/1981 Japan ........................ 307/450
0141011 7/1985 Japan ........................ 307/540

Primary Examiner—Stanley D. Miller
Assistant Examiner—Tai V. Duong
Attorney, Agent, or Firm—Bierman & Muserlian

[57] ABSTRACT

An antisaturation circuit for an integrated PNP transistor, having a generic current generator in the base branch of the bias circuit capable of limiting the maximum base current, comprises two NPN transistors, a diode and a voltage divider formed by two resistors, and permits to limit the base current of the PNP transistor below the maximum value, set by the current generator, every time the voltage across the base-collector junction of the PNP transistor exceeds a certain preset value thus preventing saturation or limiting it.

2 Claims, 1 Drawing Figure

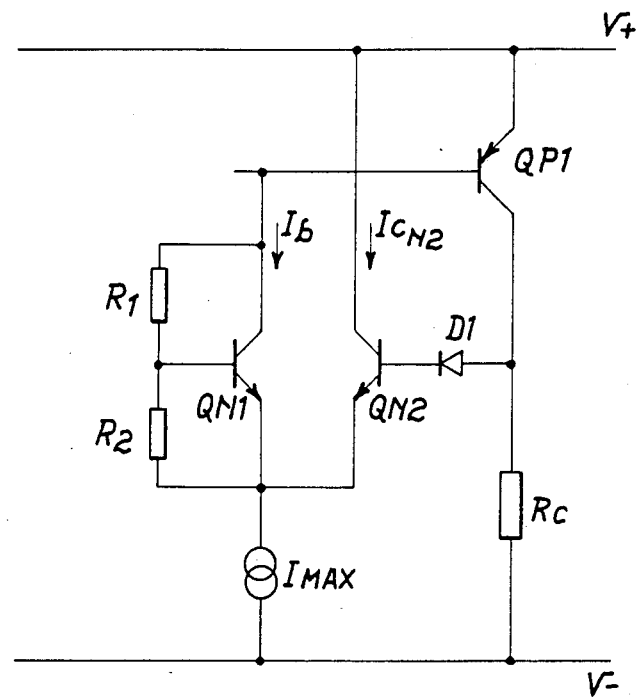

ANTISATURATION CIRCUIT FOR INTEGRATED PNP TRANSISTOR

BACKGROUND OF THE INVENTION

The present invention pertains to an antisaturation circuit for PNP transistors in monolithic integrated circuits. Such integrated circuits are formed on a single chip of semiconductor, most of the times silicon, through a suitable sequence of fabrication phases comprising surface oxidation, photolithography, epitaxial growth, impurities diffusion, metallization. With these processes diodes, transistors and passive components are formed which are interconnected on the chip itself by means of suitable metallizations.

Integrated PNP transistors, that is formed on the substrate, that is on the chip of semiconductor material, present, in operation, a particular problem. When the PNP transistor is driven to the saturation zone of its characteristic, it may give rise to a leakage current toward the substrate which may result untolerable for the correct operation of the whole integrated circuit. Under saturation conditions, that is with the substantial dropping to zero of the $V_{CE}$ voltage of its transistor, the base may come to find itself at a lower potential with respect to the potential of the collector and thence the base-collector junction may become forward biased. This situation creates a parasitic PNP transistor through the base-collector junction of the real transistor whose collector functions as the emitter of the parasitic transistor the latter's collector being represented by the substrate of semiconductor material of the chip.

Naturally this problem is particularly felt in case of integrated PNP power transistors both for the levels of the currents as well as for the increased probability that such transistors be driven accidentally to saturation, for example, with the variation of the load impedance of the transistor.

SUMMARY OF THE INVENTION

It is therefore an object of the present invention to provide a protection circuit capable of avoiding that the base-collector junction of an integrated PNP transistor be forward biased and, consequently, of preventing substantial leakage currents toward the substrate.

It is a further object of the present invention to provide an antisaturation circuit for an integrated PNP transistor whose performances be substantially insensitive to temperature variations.

These objectives and advantages are obtained by the particularly simple and effective circuit of the invention which is easily integrated on the chip containing the PNP transistor which, desirably, should not saturate or should saturate not too deeply in the event of accidental conditions of input signal or of load.

The circuit of the invention for preventing saturation of an integrated PNP transistor having a generic current generator in the base branch of its bias circuit capable of limiting the maximum base current and having the emitter connected to a common, high potential node of the circuit and the collector connected through a load to a common, low potential node of the circuit is characterized in:

a first transistor;
a second NPN transistor;
the emitter of said first NPN transistor and the emitter of said second NPN transistor being connected in common and to one pole of said current generator;
the other pole of said current generator being connected to said common, low potential node of the circuit;
the collector of said first NPN transistor being connected to the base of said PNP transistor, constituting an input node of the circuit;
the base of said first NPN transistor being connected to an intermediate point if a voltage divider formed by at least a first resistor connected across the base itself and the collector and a second resistor connected across the base itself and the emitter of said first NPN transistor;
the collector of said second NPN transistor being connected to said common, high potential node of the circuit;
the base of said second NPN transistor being connected to the cathode of a diode whose anode is connected to the collector of said PNP transistor, constituting an output node of the circuit;
the values of said resistors forming said voltage divider biasing the base of said first NPN transistor being chosen so as to adjust the collector-emitter voltage of said first NPN transistor VCEN1 type:

$$V_{CEN1} = V_{BEN2} + V_{D1} - V_{CBMAX}$$

(in absence of possible passive components in the loop) where $V_{CBMAX}$ is the maximum tolerable voltage between collector and base of the PNP transistor beyond which the QN2 transistor conducts thus limiting the base current of the PNP transistor and preventing deep saturation thereof.

DESCRIPTION OF THE PREFERRED EMBODIMENT

With the aim of better illustrating the invention, the description proceeds making reference to the annexed FIGURE which is an electric diagram representative of a practical embodiment of the invention particularly preferred.

In the FIGURE, the PNP transistor, QP1, is shown connected to a load resistance $R_C$ and having a generic current generator $I_{MAX}$ in the base branch of its bias circuit. The generator is generally capable of limiting the base current of the transistor to a maximum preset value. The antisaturation circuit of the invention is represented by the two NPN transistors, respectively QN1 and QN2, by the diode D1 and by the divider formed by the two resistors $R_1$ and $R_2$ connected as shown. Therefore the maximum current through the $I_{MAX}$ generator shall be represented substantially by the sum of the base current $I_b$ of the PNP transistor, QP1, and of an eventual current $I_{CN2}$ through transistor QN2.

In case that, for a certain value of the load $R_C$, or for another reason transistor QP1 approaches saturation conditions, it is sufficient that transistor QN2 conduct in order that the base current $I_b$ be positively limited below the maximum value preset by the generator $I_{MAX}$.

Therefore, when, during normal operating conditions, transistor QP1 is outside its saturation region, that is its collector-base voltage $V_{CBP1}$ is lower than a certain preset maximum voltage $V_{CBMAX}$, the voltage between collector and emitter of transistor QN1 (in series to the base current generator) satisfy the equation:

$$V_{CEN1} = V_{BEN2} + V_{D1} - V_{CBP1}$$

By assigning a certain tolerable maximum value to the collector-base voltage of the transistor QP1, $V_{CBMAX}$, it is then possible to suitably dimension $R_1$ and $R_2$ in order that the voltage between collector and emitter of transistor QN1 satisfy the equation:

$$V_{CEN1} = V_{BEN2} + V_{D1} - V_{CBMAX}$$

Transistor QN2 is normally in cut-off conditions, that is not conducting, because of the large voltage difference existing across its base and its collector. If the PNP transistor, QP1, enters the saturation zone (for example upon a sudden increase of the load impedance) the sudden fall of the voltage between its emitter and its collector and the consequent rise of the voltage across the load resistance $R_C$ brings such a base voltage of transistor QN2 to approach until almost reaching the voltage of its collector determining conduction through the transistor.

Therefore, the current $I_{CN2}$ "substracts" a substantial portion from the maximum base current determined by the generator $I_{MAX}$, drastically reducing the effective base current $I_b$ of the PNP transistor, QP1, thus preventing its saturation or limiting the degree thereof.

With the resetting of normal load conditions, transistor QN2 returns to cut-off conditions following the decrease of its base voltage and current $I_{CN2}$ drops to zero again.

The antisaturation circuit of the present invention offers the additional advantage of being substantially insensitive to variations of temperature.

In fact, all the terms of the equation discussed above present the same type of dependency from temperature, all the voltages being relative to junctions of the same character, therefore with increasing temperature decreases the voltage $V_{CBMAX}$ at which the antisaturation circuit intervenes to prevent saturation of transistor QP1 or to limit the degree thereof.

Notwithstanding the invention having been described with reference to the electric diagram of the preferred embodiment, it is intended that variations and modifications of such a diagram may be made by the expert technician though remaining within the spirit and scope of the invention as defined in the annexed claims.

For example, the circuit of the invention may contain other elements. E.g. passive elements, such as resistors, may be present in various branches of the circuit, i.e., resistors may be inserted, for different reasons, in the base branch of one or more of the transistors QP1, QN1 and QN2, or in the collector branch of transistor QN2, without modifying the essential performance of the circuit of the invention.

Therefore, unlike what shown in the FIGURE, should one or more passive elements be present in the considered loop of the circuit that is in the loop relative to the equation discussed above, the equation itself shall contain a term, $V_R$, representative of the voltage drop across such one or more passive elements present in the circuit loop.

What we claim is:

1. An antisaturation circuit for an integrated PNP transistor, said PNP transistor having a current generator in the base branch capable of determining a maximum base current, an emitter connected to a common, high potential node of the circuit and a collector connected through a load to a common, low potential node of the circuit, comprising:

a first NPN transistor having an emitter, a base and a collector;

a second NPN transistor having an emitter, a base and a collector;

the emitter of said first NPN transistor and the emitter of said second NPN transistor being connected in common and to one pole of said current generator;

the other pole of said current generator being connected to said common, low potential node of the circuit;

the collector of said first NPN transistor being connected to the base of said PNP transistor constituting an input node of the circuit;

the base of said first NPN transistor being connected to an intermediate point of a voltage divider formed by at least a first resistor connected across the base and the collector of said first NPN transistor and a second resistor connected across the base and the emitter of said first NPN transistor;

the collector of said second NPN transistor being connected to said common, high potential node of the circuit;

the base of said second NPN transistor being connected to a cathode of a diode whose anode is connected to the collector of said PNP transistor constituting an output node of the circuit;

the values of said resistors forming said voltage divider biasing the base of said first NPN transistor being chosen so as to adjust the collector-emitter voltage of said first NPN transistor VCEN1 to satisfy the equation $$V_{CEN1} = V_{BEN2} + V_{D1} - V_{CBMAX}$$

where VBEN2 is the base-emitter voltage of said second NPN transistor, VD1 is a voltage drop across said diode and VCBMAX is a desired maximum tolerable voltage between collector and base of said PNP transistor.

2. The circuit of claim 1 wherein the VCEN1 voltage of said first NPN transistor is adjusted so as to satisfy the equation $$V_{CEN1} = V_{BEN2} + V_{D1} - V_{CBMAX} + (V_R)$$

where $(V_R)$ is the voltage drop across any passive element present in the circuit to which the above equation relates.

* * * * *